United States Patent

Ikeno

[11] Patent Number: 5,864,405
[45] Date of Patent: Jan. 26, 1999

[54] INSPECTION APPARATUS OF ELECTRONIC COMPONENT

[75] Inventor: Shigeo Ikeno, Tokorozawa, Japan

[73] Assignee: Vanguard Systems Inc., Saitama, Japan

[21] Appl. No.: 843,890

[22] Filed: Apr. 17, 1997

[30] Foreign Application Priority Data

Apr. 26, 1996 [JP] Japan .................................. 8-106659

[51] Int. Cl.$^6$ .............................. G01B 11/00; G01B 9/08
[52] U.S. Cl. .......................................... 356/390; 356/392
[58] Field of Search .................................... 356/390–394, 356/237, 375; 382/146; 348/126; 250/559.34

[56] References Cited

U.S. PATENT DOCUMENTS

| | | | |
|---|---|---|---|
| 4,585,351 | 4/1986 | Gronek et al. | 356/388 |
| 5,131,753 | 7/1992 | Pine et al. | 356/394 |
| 5,278,632 | 1/1994 | Shotwell | 356/388 |
| 5,452,080 | 9/1995 | Tomiya | 356/237 |
| 5,563,703 | 10/1996 | Lebeau et al. | 356/237 |
| 5,621,530 | 4/1997 | Marrable, Jr. | 356/237 |

*Primary Examiner*—Robert Kim
*Attorney, Agent, or Firm*—Koda & Androlia

[57] ABSTRACT

Terminal groups (2a), (2b), (2c) and (2d) extending in respective directions, of an IC (1) disposed on a stage (11) are reflected by first mirrors (31a), (31b), (31c) and (31d) down toward second mirrors (32a), (32b), (32c) and (32d). The terminal groups are reflected by the second mirrors toward the center and are further reflected by third mirrors (33a), (33b), (33c) and (33d) downward. The reflected terminal groups are received by a lens unit (35) and image taking means to be displayed in a display screen so that front images of the terminal groups of the IC (1) in the respective directions as viewed from the sides thereof can be displayed in the same display screen. Accordingly, the terminal groups in the respective directions can be inspected at one time.

4 Claims, 4 Drawing Sheets

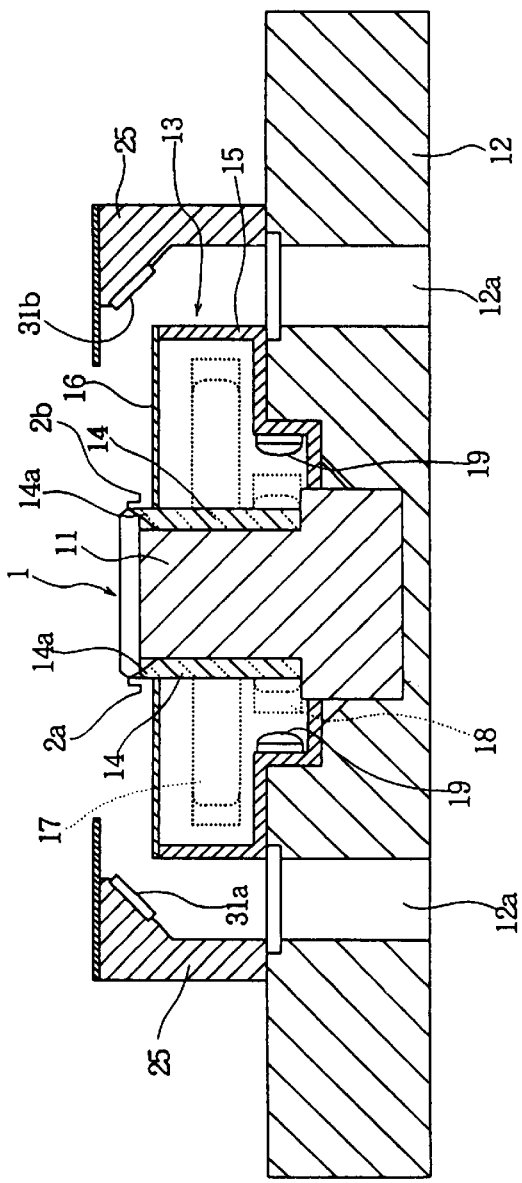
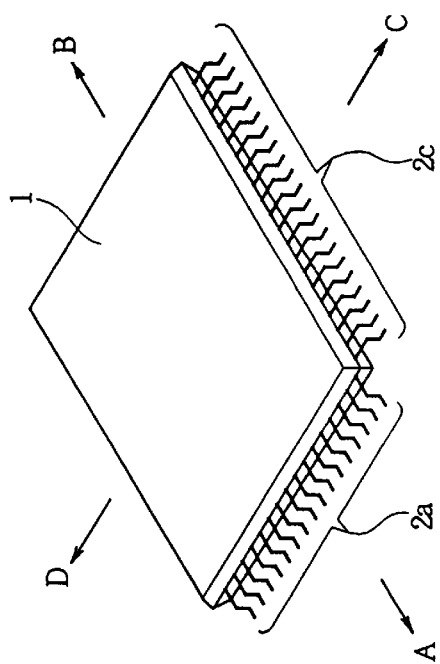
Fig. 4
Fig. 5

INSPECTION APPARATUS OF ELECTRONIC COMPONENT

BACKGROUND OF THE INVENTION

1. Field of the Invention

The present invention relates to an inspection apparatus of terminal groups (portions to be inspected) extending from an outer periphery of an electronic component such as an integrated circuit (IC), and more particularly to an inspection apparatus of an electronic component capable of displaying the portions to be inspected such as the terminal groups disposed in a plurality of directions onto the same plane.

2. Prior Art

FIG. 5 shows an integrated circuit (IC) as an example of an electronic component. A plurality of terminal groups (2a), (2b), (2c) and (2d) are disposed on four sides of the IC (1). The terminal groups (2a), (2b), (2c) and (2d) are protruded in the directions of (A), (B), (C) and (D), respectively. In FIG. 5, only the terminal groups (2a) and (2c) are shown.

The terminal groups (2a), (2b), (2c) and (2d) each include a large number of terminals. When the IC (1) is mounted on a circuit board, the terminals constituting the terminal groups (2a), (2b), (2c) and (2d) are joined to land portions formed on the circuit board by means of solder paste. The solder paste is melted by a heating furnace and cooled to thereby be hardened, so that the terminals are soldered to the land portions.

In order to mount the IC (1) on the circuit board exactly, it is necessary that all of the terminals of the terminal groups (2a), (2b), (2c) and (2d) protruded in the respective directions can be brought into contact with the land portions on the circuit board stably. For example, when any terminal is deformed to be separated from the land portion, the deformed terminal fails to come into contact with the land portion and cannot be electrically connected to the land portion exactly. Further, when any terminal is deformed to be protruded downward, a plurality of terminals positioned on both sides thereof are separated from the land portions to form space therebetween, so that soldering therebetween is failed. Accordingly, before the IC (1) is mounted on the circuit board, it is necessary to inspect whether all tips of the terminals of the terminal groups protruded in the respective directions (A), (B), (C) and (D) are aligned on the same plane or not.

Heretofore, the inspection is made by means of eyes or an image taking apparatus, while the inspection is made separately in the respective directions of (A), (B), (C) and (D).

However, the inspection using eyes is difficult to examine delicate unalignment or ununiformity of the terminal groups including the numerous terminals one by one.

Further, in the conventional inspection using the image taking apparatus, it is necessary to rotate or move the IC (1) or the image taking apparatus in order to take images of the terminal groups in the respective directions and the inspection process requires much labor and time. In addition, ununiformity of the separate terminals in the terminal group in each direction can be examined, while it is impossible to compare and examine uniformity of the tips of the terminals between the terminal groups protruded in different directions. Accordingly, even when the tips of the terminals of the terminal group protruded in each direction are aligned or uniformed, there is a case where the tips of the terminals of the terminal groups protruded in different directions are not necessarily aligned with one another when the tips are compared with one another. In such a case, it is impossible to bring all the terminals into contact with the land portions stably.

Accordingly, it is desired to develop the inspection apparatus of an electronic component which can compare the terminal groups in all the directions.

SUMMARY OF THE INVENTION

It is an portion of the present invention to provide an inspection apparatus of an electronic component in which portions to be inspected such as terminal groups extending from the electronic component such as an IC in a plurality of directions can be displayed in the same display screen so that the portions can be inspected at one time while being compared with one another.

In a preferred example of the present invention, illuminating members disposed within the terminal groups constituting the portions to be inspected are disposed at the stage on which the electronic component is put and the terminal groups extending in the respective directions are displayed on the same display screen of the display unit while using illuminating light from the illuminating members as background.

When images of the portions such as the terminal groups protruded in the plurality of directions from the electronic component are taken by image taking means and the images are clear, it is not necessary to provide the illuminating means. However, when the portions to be inspected are a plurality of minute terminals put side by side, shadows of the images are produced in spaces between the terminals. In order to eliminate the shadows, it is desirable to dispose the illuminating members forming the rear lighting inside the terminal groups. Consequently, the plurality of terminals are displayed on the display screen of the display unit clearly while using the illuminating members as the rear lighting. Accordingly, arrangement and deformation of the numerous terminals disposed at a short pitch can be inspected exactly.

In a definite structure, a plurality of mirror groups are disposed in multiple directions to which the portions to be inspected of the electronic component are directed. More particularly, the plurality of mirror groups include first mirrors disposed obliquely opposite to the portions, second mirrors for directing images reflected by the first mirrors toward the center, and third mirrors for projecting the images reflected by the second mirrors on the same plane.

Further, in order to receive the images projected from the mirror groups on the same plane, the optical system having a deep depth of focus and small variation of the magnification is used. When this optical system is used to inspect the electronic component of a certain kind, focusing of the front images is merely made at the first stage. Thereafter, as far as the electronic components of the same kind are inspected successively, it is not necessary to make focusing for each electronic component separately. Further, since the variation of the magnification is small, the size of the front image of each component is not varied. Accordingly, a plurality of electronic components of the same kind can be always inspected uniformly with the clear standard.

The electronic component to be inspected of the present invention is, for example, an IC. Portions to be inspected are, for example, terminal groups including numerous terminals extending in respective directions from respective sides of the IC. However, the electronic component is not limited to the IC and any electronic component can be inspected as far as the electronic component includes the plurality of terminal groups to be soldered to land portions on a circuit board.

Further, the portions to be inspected are not limited to the terminal groups and formation or formed states, for example, of sides of the electronic component can be also inspected. Front images of the portions to be inspected displayed in the display unit may be inspected by eyes or may be processed to express arrangement or deformation of the terminals quantitatively as a numerical value so that inspection may be made on the basis of the numerical value to judge whether the terminals are failed or not.

BRIEF DESCRIPTION OF THE DRAWINGS

FIG. 4 is a partially enlarged sectional view showing a structure of a stage and an illuminating unit; and FIG. 5 is a perspective view showing an integrated circuit (IC) as an example of an electronic component.

DESCRIPTION OF THE PREFERRED EMBODIMENT

Figure 3:
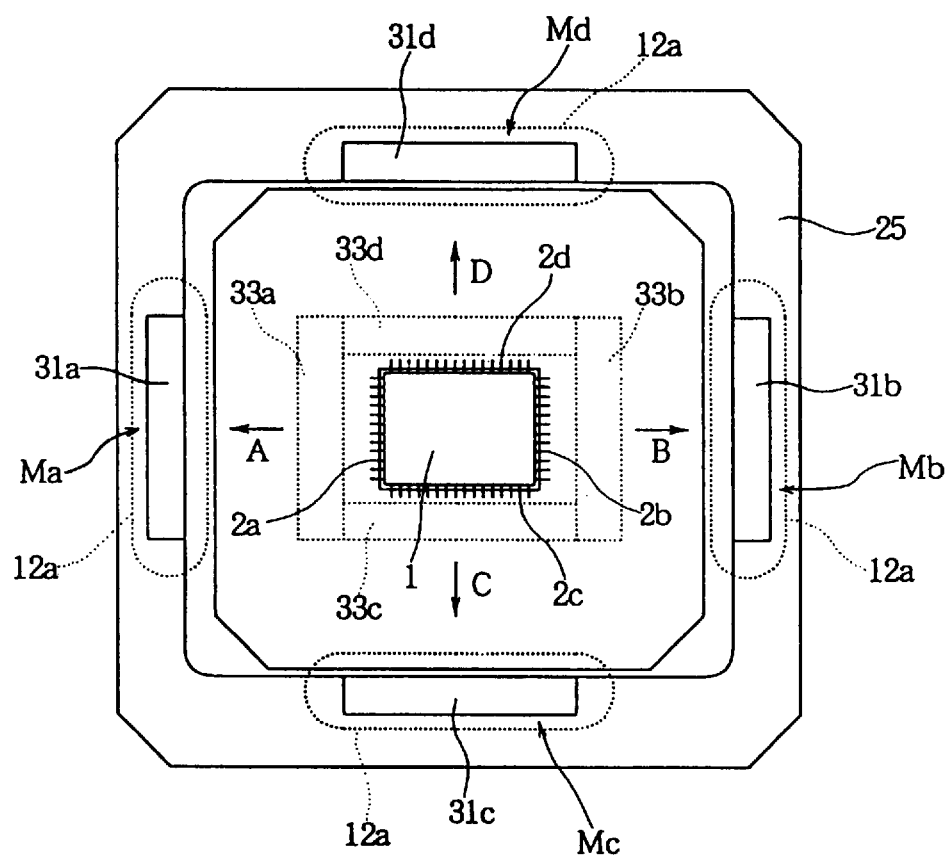
FIG. 3 is a plan view of FIG. 2.

An electronic component to be inspected by the inspection apparatus is an integrated circuit (IC) (1) as shown in FIGS. 3 and 5. The IC (1) includes terminal groups (2a), (2b), (2c) and (2d) extending in the directions of (A), (B), (C) and (D), respectively. The terminal groups are portions to be inspected. The inspection apparatus can inspect arrangement or alignment and deformation of terminals constituting the terminal groups extending in the respective directions. In addition, the inspection apparatus can compare the terminal groups in all the directions with one another to inspect the terminal groups.

Figure 1:
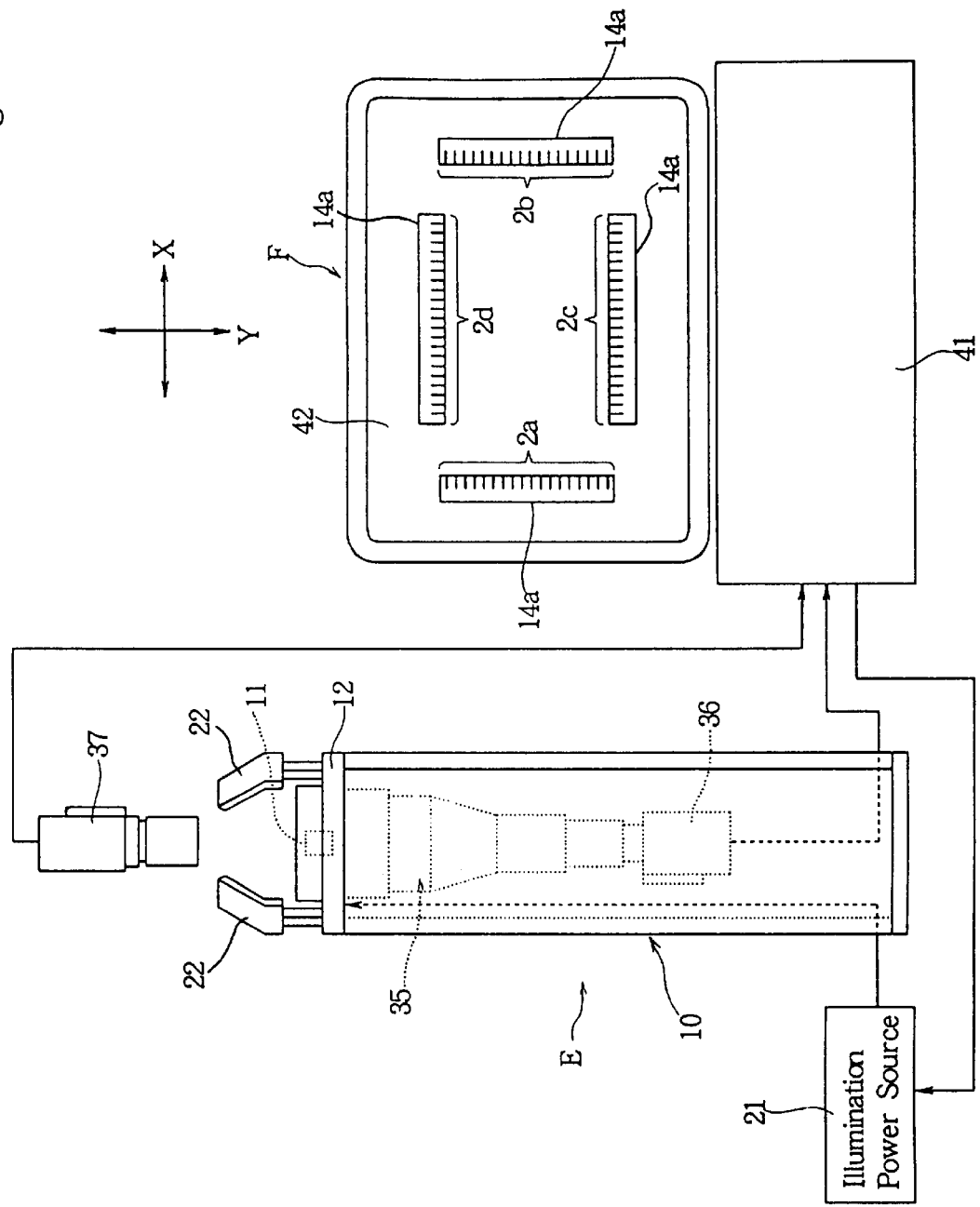
FIG. 1 is a front view showing the whole structure of an inspection apparatus of an electronic component according to the present invention.

The inspection apparatus shown in FIG. 1 includes a body (E) and a display unit (F). The body (E) includes a stand (10) and a stage (11) is disposed on the stand (10). FIG. 4 is an enlarged view showing a portion in which the stage (11) is disposed. As shown in FIGS. 1 and 4, a stage base (12) is fixedly mounted on the top of the stand (10). The stage (11) is fixedly mounted in the middle of the upper surface of the stage base (12). A body of the IC (1) shown in FIG. 5 is put on the upper end portion of the stage (11). The terminal groups (2a), (2b), (2c) and (2d) of the IC (1) extending in the directions (A), (B), (C) and (D) are disposed to point to the lower portion ahead of the four sides of the stage (11).

An illuminating unit (13) is mounted in the stage (11). The illuminating unit (13) includes illuminating members (14) disposed in close contact with the four sides of the stage (11). Tips (14a) of the illuminating members (14) are disposed opposite to the inner sides of the terminal groups (2a), (2b), (2c) and (2d). The illuminating members (14) are formed of light transmissive or semitransparent material such as milk white acryl plate.

Further, the illuminating unit (13) includes a case (15) for enclosing the illuminating members (14) other than the tips (14a) thereof and a lid (16) for covering the upper portion of the case (15). Disposed in the case (15) are light guiding members (17) and (18) disposed in close contact with the illuminating members (14) disposed on the four sides of the stage (11). The light guiding members (17) and (18) are also formed of light transmissive or semitransparent material such as acryl plate similarly to the illuminating members (14). Further, light emitting means (19) such as LEDs are disposed to give light to the light guiding members (17) and (18). The light emitting means (19) for giving light to the lower light guiding member (18) is shown in FIG. 4. The light emitting means for giving light to the upper light guiding member (17) is disposed opposite to the light guiding member (17) in the direction perpendicular to the paper of FIG. 4 and accordingly the light emitting means is not shown in FIG. 4. Light emitted from the light emitting means (19) is guided through the light guiding members (17) and (18) to the illuminating members (14). The light emitted from the tips (14a) of the illuminating members (14) illuminates the terminal groups (2a), (2b), (2c) and (2d) from the rear sides thereof.

As shown in FIG. 1, an illumination power source (21) for energizing the light emitting means (19) to emit light is disposed near the body (E). A plurality of illuminating units (22) for illuminating the stage (11) are disposed above the stand (10). The illuminating units (22) are constituted by, for example, LEDs or lamps or fluorescent lamps and are supplied with electric power from the illumination power source (21) to energize the illuminating units (22) to emit light. In the inspection apparatus, the illumination power source (21) can be controlled by a computer body (41) described later to thereby adjust an amount of light of the illuminating units (22).

In the inspection apparatus, when a size of the IC (1) which is an electronic component to be inspected is changed, the stage (11) is exchanged. In this case, only the stage (11) may be exchanged or the stage (11) and the illuminating unit (13) may be exchanged together.

Figure 2:
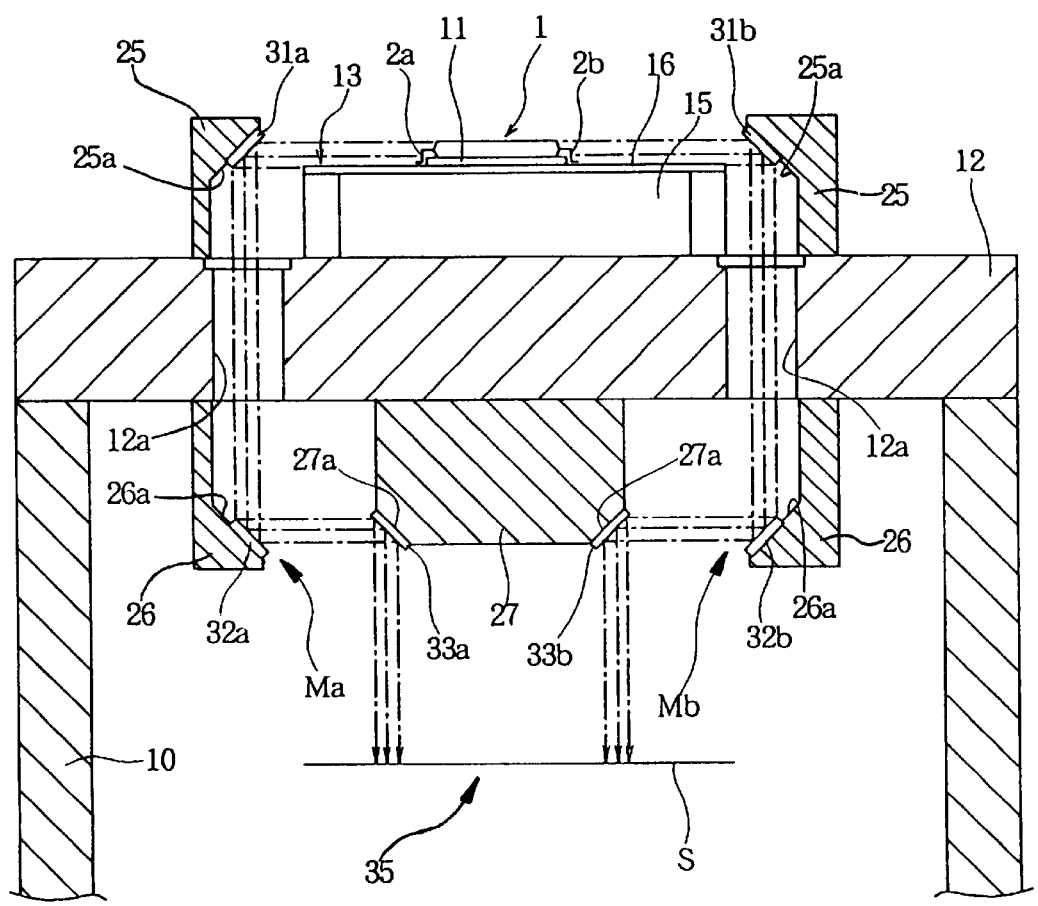
FIG. 2 is a partially enlarged sectional view showing a structure of a stage and mirrors.

FIGS. 2 and 3 show an arrangement of mirror groups. An upper frame (25) is fixedly mounted on the upper surface of the stage base (12) and a lower frame (26) is fixedly mounted on the lower surface of the stage base (12). Further, mirror mounting planes (25a) are formed in the upper frame (25) to be inclined at an angle of 45 degrees with respect to the vertical surface and the horizontal surface. In addition, mirror mounting planes (26a) are also formed in the lower frame (26) to be inclined at an angle of 45 degrees with respect to the vertical surface and the horizontal surface similarly. Furthermore, a pedestal (27) is fixedly mounted on the lower surface of the stage base (12) and mirror mounting planes (27a) are formed in a lower corner of the pedestal (27) to be inclined at an angle of 45 degrees. The mirror mounting planes (25a), (26a) and (27a) are disposed in four directions to be opposed to the sides of the IC (1) shown in FIG. 3 in the directions of (A), (B), (C) and (D).

As shown in FIG. 3, mirrors constituting mirror groups (Ma), (Mb), (Mc) and (Md) disposed in four directions are fixedly mounted in the mirror mounting planes. The mirror group (Ma) can obtain a front image of the terminal groups (2a) of the IC (1) extending in the direction of(A). Similarly, the mirror groups (Mb), (Mc) and (Md) can obtain front images of the terminal groups (2b), (2c) and (2d) extending in the directions of (B),(C)and(D), respectively. The mirror groups (Ma) and (Mc) are shown in FIG. 2.

The mirror groups (Ma), (Mb), (Mc) and (Md) include first mirrors (31a), (31b), (31c) and (31d) fixedly mounted on the mirror mounting plane (25a) of the upper frame (25), second mirrors (32a), (32b), (32c) and (32d) fixedly mounted on the mirror mounting plane (26a) of the lower frame (26), and third mirrors (33a), (33b), (33c) and (33d) fixedly mounted on the mirror mounting plane (27a) of the pedestal (27), respectively. Further, four through-holes (12a) are formed in the stage base (12).

The images reflected by the first mirrors (31a), (31b), (31c) and (31d) downward in the vertical direction pass through the through-holes (12a) and are then received by the second mirrors (32a), (32b), (32c) and (32d), respectively.

The light reflected by the second mirrors (32a), (32b), (32c) and (32d) inward in the horizontal direction is reflected by the third mirrors (33a), (33b), (33c) and (33d) downward in the vertical direction, respectively, so that the front images of the four sides of the IC (1) in the four directions are directed toward a plane (S) shown in FIG. 2.

A lens unit (35) for receiving the light reflected to the plane (S) is disposed within the stand (10) of the body (E). The lens unit (35) is constituted by an optical system having a deep depth of a focus and small variation of the magnification. The light focused by the lens unit (35) is received by a CCD (Charge Coupled Device) camera (36) disposed as image taking means. Further, an upper CCD camera (37) for receiving an image of the stage (11) and the periphery thereof as a flat image is disposed above the stage (11).

As shown in FIG. 1, the images received by the CCD camera (36) and the upper CCD camera (37) are supplied to the display unit (F). The display unit (F) is constituted by a personal computer and includes the computer body (41) and a display screen (42). A image processing software is stored in memory means in the computer body (41). The images received by the CCD camera (36) and the upper CCD camera (37) are processed by the software and are displayed in the display screen (42).

In the inspection apparatus having the above structure, the IC (1) to be inspected is put on the stage (11) in close contact with the upper surface of the stage (11). At this time, the terminal groups (2a), (2b), (2c) and (2d), which are the portions to be inspected, extending in the directions of (A), (B), (C) and (D) are positioned ahead of the tips (14a) of the illuminating members (14).

When electric power is supplied from the illumination power source (21), the light emitting means (19) of the illuminating unit (13) shown in FIG. 4 emits light. The light is sent through the light guiding members (17) and (18) to the illuminating members (14) and is emitted from the tips (14a) of the illuminating members (14) disposed on the four sides of the stage (11). Further, the illuminating units (22) disposed in the upper portion are supplied with electric power from the illumination power supply (21) to emit light so that the stage (11) and the periphery thereof are illuminated.

The rear sides of the terminal groups (2a), (2b), (2c) and (2d) of the IC (1) in the respective directions are illuminated by the tips (14a) of the illuminating members (14). The front images of the terminal groups (2a), (2b), (2c) and (2d) as viewed horizontally in the directions of (A), (B), (C) and (D) are reflected by the first mirrors (31a), (31b), (31c) and (31d) of the mirror groups (Ma), (Mb), (Mc) and (Md) downward in the vertical direction. Then, the images are reflected by the second mirrors (32a), (32b), (32c) and (32d) toward the center in the horizontal direction and are further directed downward in the vertical direction by the third mirrors (33a), (33b), (33c) and (33d). The front images of the IC (1) in the directions of (A), (B), (C) and (D) are reflected by the third mirrors (33a), (33b), (33c) and (33d) toward the same plane (S). The images are focused by the lens unit (35) disposed in the plane (S) to be received by the CCD camera (36).

The images taken by the CCD camera (36) are processed by the software stored in the computer body (41) of the display unit (F) and are displayed in the same display screen (42). As shown in FIG. 1, the front images of the terminal groups (2a), (2b), (2c) and (2d) of the IC (1) as viewed horizontally in the directions (A), (B), (C) and (D) are displayed in the display screen (42) while being arranged in the four directions in the same display screen. Further, since the tips (14a) of the illuminating members (14) appear as bright rear lighting in the rear portions of the terminal groups (2a), (2b), (2c) and (2d), each of the numerous terminals of the terminal groups can be confirmed clearly.

Deformation or deformed states of the respective terminals of the terminal groups (2a), (2b), (2c) and (2d) can be confirmed in the display screen. At the same time, since the terminal groups in the respective directions can be observed while being compared with each other, states of all the terminals of the IC (1) can be confirmed at one time. In the display screen (42) shown in FIG. 1, the tips of the terminal groups (2a), (2b), (2c) and (2d) in the four directions are arranged in the directions of X and Y lines of the orthogonal coordinates. Accordingly, the tips of the terminals can be observed while using the X-Y coordinates in the display screen (42) as the reference to thereby confirm the deformed states of the terminals. Furthermore, it can be confirmed whether all the tips of the terminal groups in the respective directions are positioned on the same plane or not or whether the terminal group in any direction is inclined or not.

Further, the length of protrusion or retraction of the tips of the terminals in the X-Y coordinates can be processed quantitatively and displayed in the display screen.

In addition, the inspection apparatus can take an image of the upper surface of the IC (1) by the upper CCD camera (37) and can display the image in the display screen (42). The inspection apparatus can inspect the shape and size of the whole IC and protrusion and arrangement or alignment of the terminal groups (2a), (2b), (2c) and (2d) in the plane manner by means of the image.

As described above, according to the present invention, all of the portions to be inspected, for example, the terminal groups of the electronic component in multiple directions can be displayed while being arranged in the same plane. Accordingly, since the portions in the respective directions can be compared with each other to be inspected and the inspection accuracy can be enhanced, the quality of the electronic component can be controlled completely. Further, since the inspection work can be made at a time, the work can be made effectively.

I Claim:

1. An apparatus for inspecting protruding portions from an electronic component, said apparatus comprising:

a stage on which the electronic component having said protruding portions to be inspected, disposed in a plurality of directions is placed:

mirror groups disposed in multiple directions so as to project front images of said protruding portions as viewed in a horizontal direction on a same plane;

image taking means for taking images projected on said same plane;

display means for displaying the front images of the protruding portions taken by said image taking means on a same display screen whereby the front images of the protruding portions in the multiple directions are displayed on the same display screen of said display means;

illumination means for illuminating a rear side of said protruding portions, said illumination means comprising light transmissive material or semi-transparent material positioned at rear portions of said protruding portions of said electronic component and light emitting means for giving light to said illumination means, whereby said protruding portions are displayed on said same display screen while using bright images of tips of said illumination means as background; and a second image taking means provided above said stage for taking an upper side image of said protruding portions to be inspected and wherein both said front image and said upper side image are displayed on said same display screen of said display means.

2. An apparatus according to claim 1, further comprising a second illumination means provided above said stage for illuminating an upper side of said protruding portions to be inspected.

3. An apparatus according to claim 1, wherein said illumination means illuminates all of said rear portions of said protruding portions.

4. An apparatus according to claim 3, wherein said tips of said illumination means are triangular in cross section and are positioned at a rear portion of said protruding portions.

* * * * *